United States Patent
Tankielun (10) Patent No.: US 9,606,158 B2
(45) Date of Patent: Mar. 28, 2017

(54) SLOTLINE ANTENNA

(71) Applicant: Rohde & Schwarz GmbH & Co. KG, Munich (DE)

(72) Inventor: Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 263 days.

(21) Appl. No.: 14/057,910

(22) Filed: Oct. 18, 2013

(65) Prior Publication Data

US 2015/0035707 A1 Feb. 5, 2015

Related U.S. Application Data (60) Provisional application No. 61/861,832, filed on Aug. 2, 2013.

(51) Int. Cl.
| | |
|---|---|
| *H01Q 13/10* | (2006.01) |
| *G01R 29/10* | (2006.01) |
| *H01Q 13/08* | (2006.01) |
| *H01Q 17/00* | (2006.01) |
| *H01Q 21/24* | (2006.01) |
| *G01R 29/08* | (2006.01) |

(52) U.S. Cl.
CPC ......... *G01R 29/105* (2013.01); *H01Q 13/085* (2013.01); *H01Q 17/001* (2013.01); *H01Q 17/008* (2013.01); *H01Q 21/24* (2013.01); *G01R 29/0878* (2013.01)

(58) Field of Classification Search
CPC .. H01Q 13/106; H01Q 13/085; H01Q 17/007; H01Q 17/008; H01Q 21/24; H01Q 17/001

USPC .................. 343/767, 775, 768, 700 MS, 770
See application file for complete search history.

(56) References Cited

U.S. PATENT DOCUMENTS

| | | | | |
|---|---|---|---|---|
| 5,461,392 A | * | 10/1995 | Mott | H01Q 13/085 343/705 |
| 5,568,159 A | * | 10/1996 | Pelton | H01Q 13/085 343/767 |
| 6,552,691 B2 | * | 4/2003 | Mohuchy | H01Q 13/085 343/770 |
| 6,839,036 B1 | | 1/2005 | Apostolos et al. | |
| 7,064,722 B1 | | 6/2006 | Neel | |

(Continued)

FOREIGN PATENT DOCUMENTS

| | | |
|---|---|---|
| EP | 1425818 B1 | 6/2004 |
| GB | 2379088 A | 2/2003 |

OTHER PUBLICATIONS

Clementi et al. "A novel low profile Tapered Slot Antenna with absorbing material for radar imaging system" 2013 7th European Conference on Antennas and Propagation (EuCAP), Apr. 8-12, 2013.*

(Continued)

*Primary Examiner* — Tho G Phan
(74) *Attorney, Agent, or Firm* — Ditthavong & Steiner, P.C.

(57) ABSTRACT

An inventive antenna comprises two antenna elements forming a planar slotline antenna. The antenna furthermore comprises absorber elements surrounding the antenna elements on two layers. The absorber elements are shaped to partially cover the antenna elements and partially not cover the antenna elements. Moreover, they are shaped to dampen at least a dipole-mode of the antenna elements and not to dampen a slotline-mode of the antenna elements.

12 Claims, 8 Drawing Sheets

(56) References Cited

U.S. PATENT DOCUMENTS

| | | | | |
|---|---|---|---|---|
| 7,292,196 B2* | 11/2007 | Waterhouse | ........... | H01Q 13/10 |
| | | | | 343/767 |
| 8,736,505 B2* | 5/2014 | Lambert | .............. | H01Q 13/085 |
| | | | | 343/767 |
| 2005/0012672 A1* | 1/2005 | Fisher | .................. | H01Q 13/085 |
| | | | | 343/767 |
| 2006/0017623 A1* | 1/2006 | Luch | ........................ | H01Q 9/27 |
| | | | | 343/700 MS |
| 2009/0079649 A1* | 3/2009 | Steghafner | ......... | H01Q 13/0275 |
| | | | | 343/786 |
| 2009/0121967 A1* | 5/2009 | Cunningham | ......... | H01Q 21/26 |
| | | | | 343/908 |
| 2010/0145190 A1* | 6/2010 | Bourqui | ............... | H01Q 13/085 |
| | | | | 600/425 |
| 2010/0285753 A1* | 11/2010 | Foegelle | ................ | H04B 17/21 |
| | | | | 455/67.12 |
| 2011/0227775 A1* | 9/2011 | Hirose | ................... | H01Q 17/00 |
| | | | | 342/1 |
| 2012/0176906 A1* | 7/2012 | Hartenstein | ......... | H04L 12/2697 |
| | | | | 370/241 |

OTHER PUBLICATIONS

Chung, J.-Y., "Ultra-Wideband Dielectric-Loaded Horn Antenna with Dual-Linear Polarization Capability, In Progress in Electromagnetics Research", PIER 102, 397-411, 2010, 15 pages.

Lai, K.Y,A. et al; "A Novel Antenna for Ultra-Wide-Band Applications"'s, in IEEE Transaction on Antennas and Propagation, vol. 40, No. 7, Jul. 1992, 16 pages.

* cited by examiner

SLOTLINE ANTENNA

FIELD OF THE INVENTION

This invention relates to an improved slotline antenna

BACKGROUND OF THE INVENTION

For creating broadband antennas with low production costs, conventionally Vivaldi-antennas are used. Vivaldi-antennas consist of a tapered slotline antenna on a circuit board. Regular Vivaldi-antennas though create an electrically short antenna with a dipole-mode of radiation at signal frequencies where the antenna width W is approximately shorter than half of the signal wave length ($W<\lambda/2$). At those frequencies, unwanted radio frequency currents flow on the outer shield of the feeding coaxial cable. Thus, the cable provides unbalanced feeding and becomes an antenna part, too. This deforms the radiation pattern towards a dipole-like radiation pattern. For example, the European Patent EP 1 425 818 B1 shows such a Vivaldi-antenna. Furthermore the electrically short antenna provides typically poor reflection coefficient at the feeding port.

Accordingly, the object of the invention is to create a broadband antenna with a highly directive radiation pattern and low reflection coefficient.

SUMMARY OF THE INVENTION

The object is solved by the features of the independent claims. The dependent claims contain further developments.

In a first aspect of the inventive antenna, the antenna comprises two antenna elements forming a planar slotline antenna. The antenna furthermore comprises absorber elements surrounding the antenna elements on two layers. The absorber elements are shaped to partially cover the antenna elements and partially not cover the antenna elements. Moreover, they are shaped to dampen at least a dipole-mode of the antenna elements and not to dampen a slotline-mode of the antenna elements. By use of the setup, a high directivity and a high bandwidth of the antenna can be achieved.

According to a second aspect of the present invention, the absorber elements are advantageously of identical shape on both layers or at least of nearly identical shape. This leads to a highly symmetrical radiation pattern of the antenna.

In a third advantageous aspect of the present invention, the antenna elements are tapered. The setup allows for an especially high bandwidth of the antenna, low reflection coefficient and a desired directivity.

In a fourth advantageous aspect of the present invention, the antenna elements form a Vivaldi-antenna. A high directivity and bandwidth can therefore be reached.

In a fifth advantageous aspect of the invention, the antenna elements are formed by a metallization layer on a circuit board. The absorber elements are shaped to cover outer sections of the antenna elements and not to cover inner sections of the antenna elements. Since for low frequencies inciting the undesired dipole-mode, the current flows in the outer sections of the antenna elements, at least the dipole-mode can be dampened by surrounding these outer sections of the antenna elements by the absorber elements. For high frequencies, at which the desired slotline-mode is emitted, the currents flow mainly in the inner sections of the antenna elements and therefore should not be dampened. Therefore, absorber elements are not arranged there.

In a sixth advantageous aspect of the invention, the antenna elements are formed by a metallization layer on a circuit board. The absorber elements are shaped to cover outer sections of the antenna elements. The circuit board and the absorber elements both extend beyond these outer sections of the antenna elements. This is done, since the electrical field created by the currents flowing in the outer sections of the antenna elements at low frequencies extends beyond the area covered by the antenna elements. By placing absorber elements supported by the circuit board in these areas beyond the outer sections of the antenna elements, this electrical field is dampened.

According to a seventh advantageous aspect, the antenna elements are also formed by a metallization layer on a circuit board. The absorber elements are located on the metallization layer side of the circuit board and on a non-metallization layer side of the circuit board. By dampening the electrical field not only on the metallization layer side of the circuit board but also on a non-metallization layer side of the circuit board, the directivity and the bandwidth of the antenna can be further increased.

According to an eighth advantageous aspect of the present invention, the antenna elements are also formed by a metallization layer on a circuit board. The metallization layer is largely covered by a protective coating. The protective coating though is interrupted in a feed line connection area. This feed line connection area is located at the narrowest point between the two antenna elements. By covering the majority of the surface area, the antenna is ideally protected. By leaving the feed line connection area uncovered, radio frequency influences are minimized in the especially sensitive area with lowest distance between the two antenna elements.

According to a ninth advantageous aspect, the antenna elements are also formed by a metallization layer on a circuit board. The antenna comprises a connector for connecting an external line. Moreover, it comprises a feed line connected to the connector and to the antenna elements for feeding a signal from the external line to the antenna elements. The feed line in this case may advantageously form an impedance transformer for transforming the impedance of a coaxial feed line to the antenna impedance. For example, a narrowing feed line can be used. This allows for an optimal power transfer if antenna impedance differs from line impedance.

According to a tenth advantageous aspect of the present invention, the antenna elements are also formed by a metallization layer on a circuit board. The antenna elements comprise radiating edges. The shape of the circuit board follows the shape of the radiating edges of the antenna elements in general and extends beyond the radiating edges slightly. The antenna elements are therefore ideally supported by the circuit board. Detrimental effects by unnecessary circuit board area are prevented which reduces dispersion in antenna. By cutting the circuit board in the slot between the antenna elements the ratio of the signal power propagating in the surrounding air to the signal power propagating in the circuit board is increased. Then the transmission line medium becomes more uniform and dispersion effect is reduced. This prevents directivity drop especially at the higher bound of frequency range.

According to an eleventh advantageous aspect of the invention, an antenna system comprises two previously described antennas. The two antennas are mounted perpendicularly, intersecting along a symmetry axis between their antenna elements. The two planar antenna elements form a three-dimensional antenna system. When using only one of the previously described antennas, a linear polarization of the emitted signal is achieved. By use of a here described antenna system, it is possible to achieve arbitrarily polarized electromagnetic emission or two orthogonal linear polarizations. Alternatively by adding a 90° phase shift between the signals of the two antennas, it is possible to reach a circular-polarized emitted signal.

According to a twelfth advantageous aspect, the antenna system comprises a base plate mounted perpendicularly to both antennas on a non-radiating side of the antennas and absorbers mounted on the base plate, advantageously extending in the direction towards a radiating side of the antenna. Undesired cross-effects between the two antennas and reflection from the base plate can therefore be prevented.

In an advantageous thirteenth aspect, an antenna comprises two antenna elements forming a planar slotline antenna. The antenna elements are formed by a metallization layer on a circuit board. The antenna elements in this case comprise radiating edges. The shape of the circuit board follows the shape of the radiating edges and extends beyond the radiating edges slightly. As described earlier, a high directivity can be achieved by reduction of signal dispersion.

In a fourteenth advantageous aspect of the present invention, a measurement chamber for measuring emissions of a wireless device comprises a container sealed against electromagnetic radiation and a previously described antenna or antenna system. The device under test is placed within the test chamber and can easily be measured. The test chamber can have a low size, since the inventive antenna and antenna system only require a small space.

The motivation for introducing the absorbers is to advantageously dampen all other modes except the slotline mode. At the frequencies where an antenna width W or an antenna length L are longer as $\lambda/2$, some parasitic electromagnetic modes might be excited along the metallic edges of the antenna. The absorbers shall dampen these modes as well. As a result broad bandwidth, high directivity and low reflection coefficient is maintained.

BRIEF DESCRIPTION OF THE DRAWINGS

These and other features of the subject invention will be better understood in connection with the Detailed Description in conjunction with the Drawings of, Exemplary embodiments of the invention are now further explained with respect to the drawings, in which.

DETAILED DESCRIPTION OF THE PREFERRED EMBODIMENTS

Figure 1:
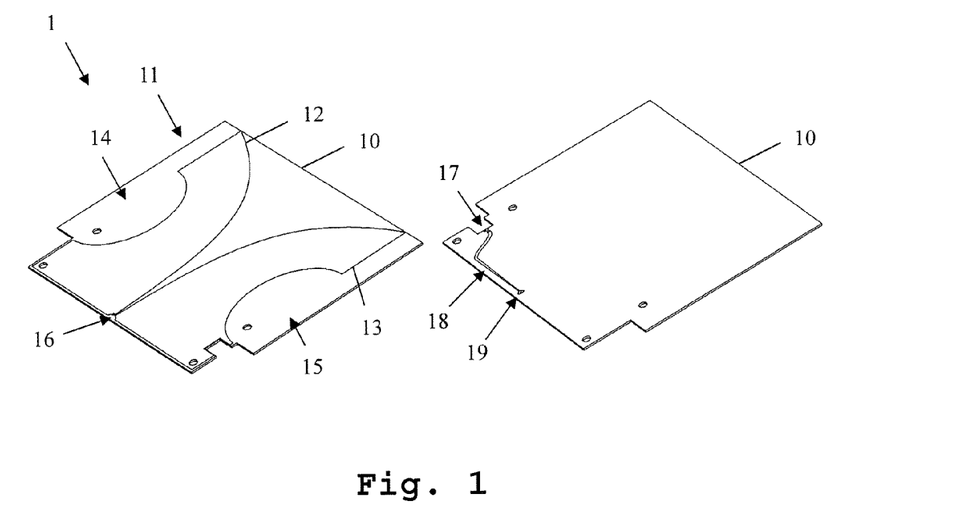
FIG. 1 shows a first embodiment of the inventive antenna in a front- and back-view with hidden absorbers.
Figure 2:
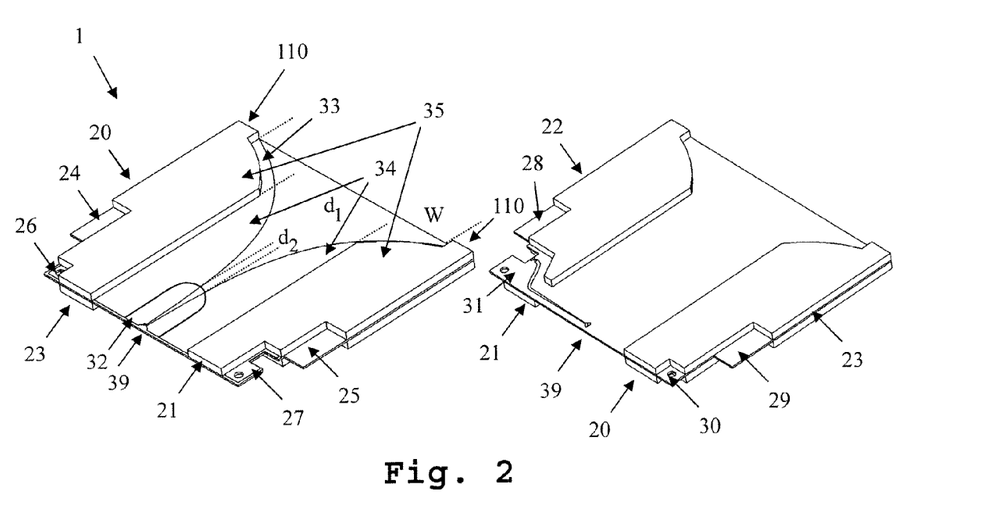
FIG. 2 shows a second view of the first embodiment of the inventive antenna in a front- and back-view.

First, we demonstrate the general construction and function of a first embodiment of the inventive antenna along FIG. 1-2. Afterwards we show the achievable measurement results using an embodiment of the inventive antenna along FIG. 3-FIG. 5. By use of FIG. 6-9 additional embodiments of the inventive antenna are described in detail. Finally, along FIG. 10, an embodiment of the inventive measuring chamber is described. Similar entities and reference numbers in different figures have been partially omitted.

First Embodiment

FIG. 1 shows a first embodiment of the inventive antenna 1. In FIG. 1, for reasons of clarity and comprehensibility, not all components of the antenna have been depicted. In FIG. 2, a view of the antenna showing all components is depicted. On the left side of the FIG. 1, a front-view of the antenna 1 is shown. On the right side, a back-view of the antenna 1 is shown.

The antenna 1 comprises a circuit board 10 and two antenna elements 12, 13 formed in a metallization layer 11 on the front side of the circuit board 10. The antenna elements 12, 13 are not connected electrically. The antenna element 13 is directly connected to a connector 17, while the antenna element 12 is connected to the connector 17 through a wire 19 and a feed line 18. The connector 17 is for example a coaxial connector. The antenna element 13 in this case is connected to the shielding of the coaxial connector, while the antenna element 12 is connected to the center line of the coaxial connector 17.

The antenna elements 12, 13 are arranged symmetrically on the front-side of the circuit board 10. The circuit board 10 extends outwardly from the symmetrical axis beyond the extent of the antenna elements 12, 13. Moreover, the antenna elements 12, 13 comprise recesses 14, 15 at their outer edges regarding the symmetry axis.

In FIG. 2, the antenna 1 from FIG. 1 is shown including all relevant components. Identical elements have been partially omitted in the description of FIG. 2. Absorber elements 20, 21, 22 and 23 are mounted on two layers surrounding the antenna elements 12, 13. The absorber elements 20, 21, 22 and 23 are mounted on the front-side and the back-side of the circuit board 10. The absorber elements 20-23 are advantageously formed from a foam material having a dielectric constant $\in_r$ between 10 and 100.

The distance $d_1$ between the absorber elements 20, 21 and 22, 23 advantageously is between 20 mm and 100 mm, most advantageously about 60 mm. Moreover $d_1$ is in the range of 30% to 70% of the entire width of the antenna. Most advantageously, $d_1$ is 50% of the width of the entire antenna.

The entire width of the antenna W is between 50 mm and 200 mm, preferably between 80 mm and 140 mm, most advantageously about 120 mm.

The absorber elements 20-23 are mostly symmetrical regarding the circuit board 10 and regarding a symmetry axis of the antenna elements 12, 13.

The absorber elements 20-23 are arranged in an outer section 35 of the circuit board 10 above and below the antenna elements. The outer section 35 is outer in regard to the central symmetry axis of the antenna elements 12, 13. The outer absorber element areas 110 of the absorber elements 20-23 extend further outwards than the antenna elements 12, 13 regarding the central symmetry axis.

An inner section 34 regarding the central symmetry axis of the antenna elements 12, 13 is not covered by the absorber elements 20-23. Moreover, the absorber elements 20-23 form recesses 33 regarding an emitting edge of the antenna elements 12, 13. Also, the absorber elements 20-23 form recesses 24, 25, 28, 29 in the outer sections 35. These recesses 24, 25, 28, 29 can advantageously be used for mounting the antenna. Also, the absorber elements 20-23 form recesses 26, 27, 30, 31 at a non-emitting side of the antenna 1. These recesses 26, 27, 30, 31 can also be used for mounting the antenna 1.

The metallization layer 11 shown in FIG. 1 is largely covered by a protective coating. The protective coating is therefore placed on the circuit board 10 directly where no antenna elements 12, 13 are formed and on the antenna elements 12, 13 where they are formed. The protective coating is advantageously placed on the top and bottom of the circuit board. Near a feed line connection area 39, a recess 32 within the protective coating is formed. This is done, so that the protective coating does not influence the antenna radio frequency behavior in the especially sensitive section of the antenna, where the antenna elements 12, 13 have minimal distance. The recess 32 within the protective coating extends until the distance between the antenna elements 12, 13 towards the emitting side of the antenna reaches $d_2$. Advantageously, $d_2$ is between 2 mm and 8 mm, most advantageously 5 mm.

Figure 3:
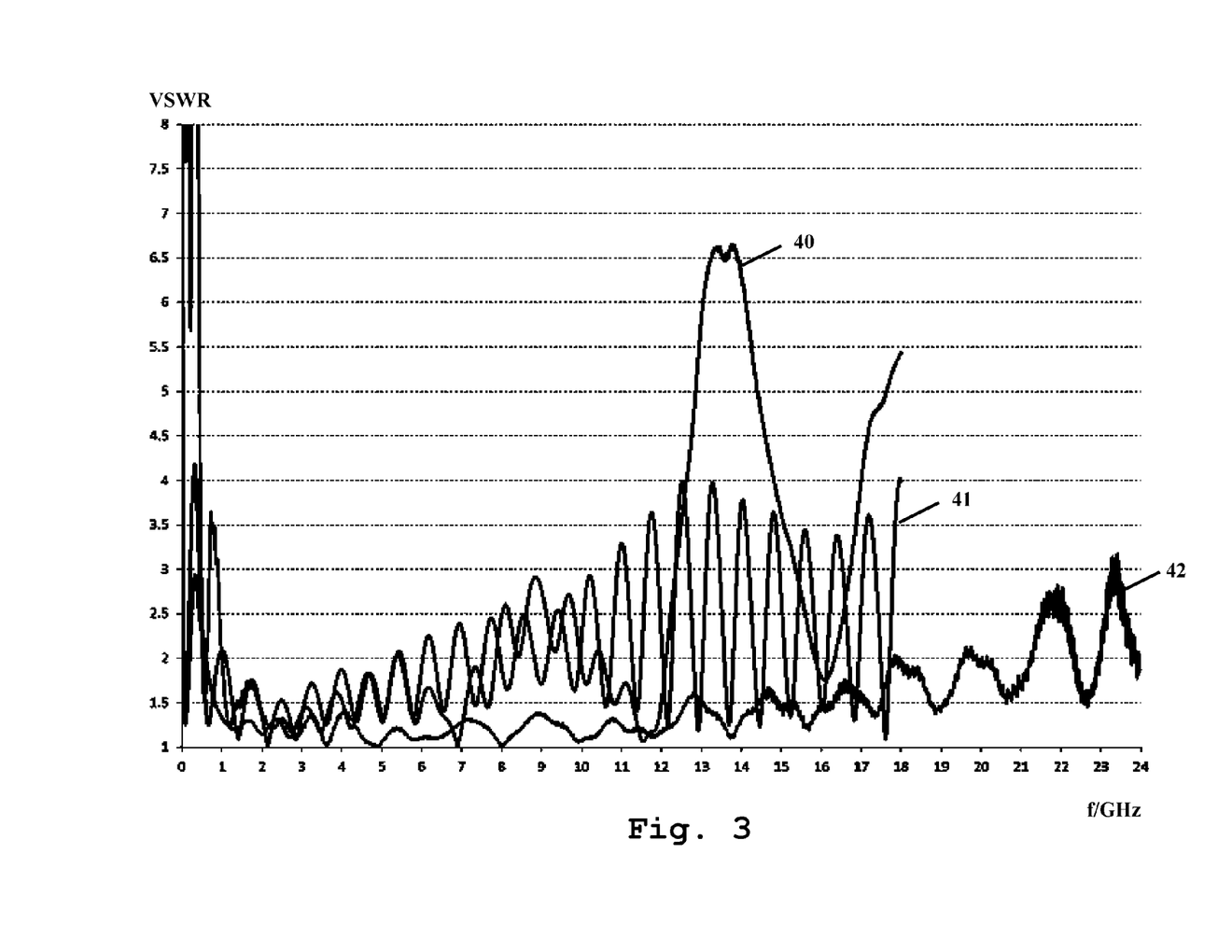
FIG. 3 shows a VSWR achievable by use of an inventive antenna.

In FIG. 3 the performance of an example of an inventive antenna is shown. The VSWR (Voltage Standing Wave Ratio) of different antenna types is depicted over frequency. The curve 40 and the curve 41 show exemplary regular antennas. The curve 42 shows an exemplary embodiment of the inventive antenna. It can clearly be seen that the performance of the inventive antenna is most advantageous.

Figure 4:
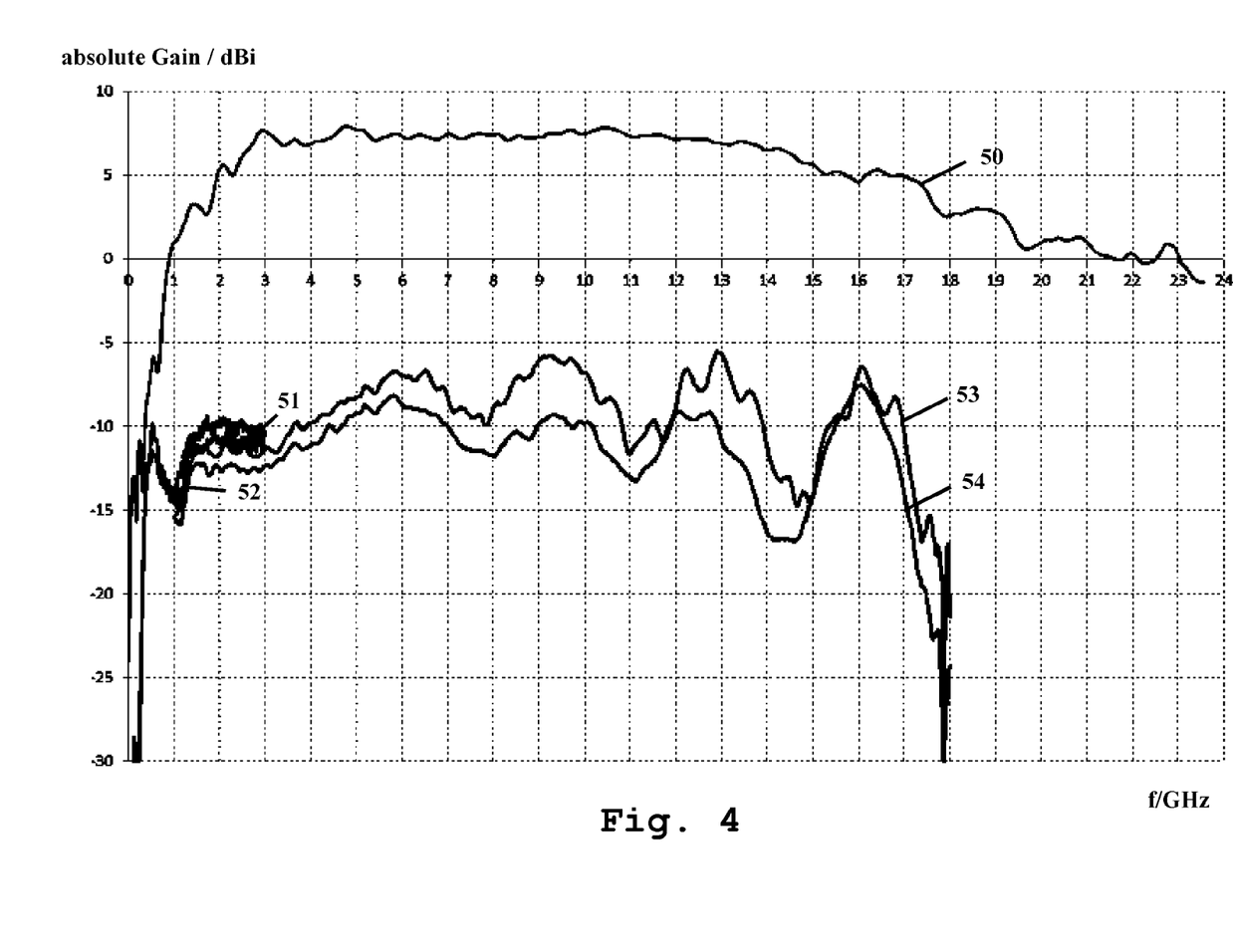
FIG. 4 shows an absolute gain achievable by use of an inventive antenna without a cut.

Moreover, in FIG. 4 the absolute gain of different antenna types over frequency is shown. The curve 50 shows the performance of an inventive antenna, while the curves 51-54 show the performance of regular broadband antennas. It can clearly be seen that the inventive antenna is very advantageous.

Figure 5:
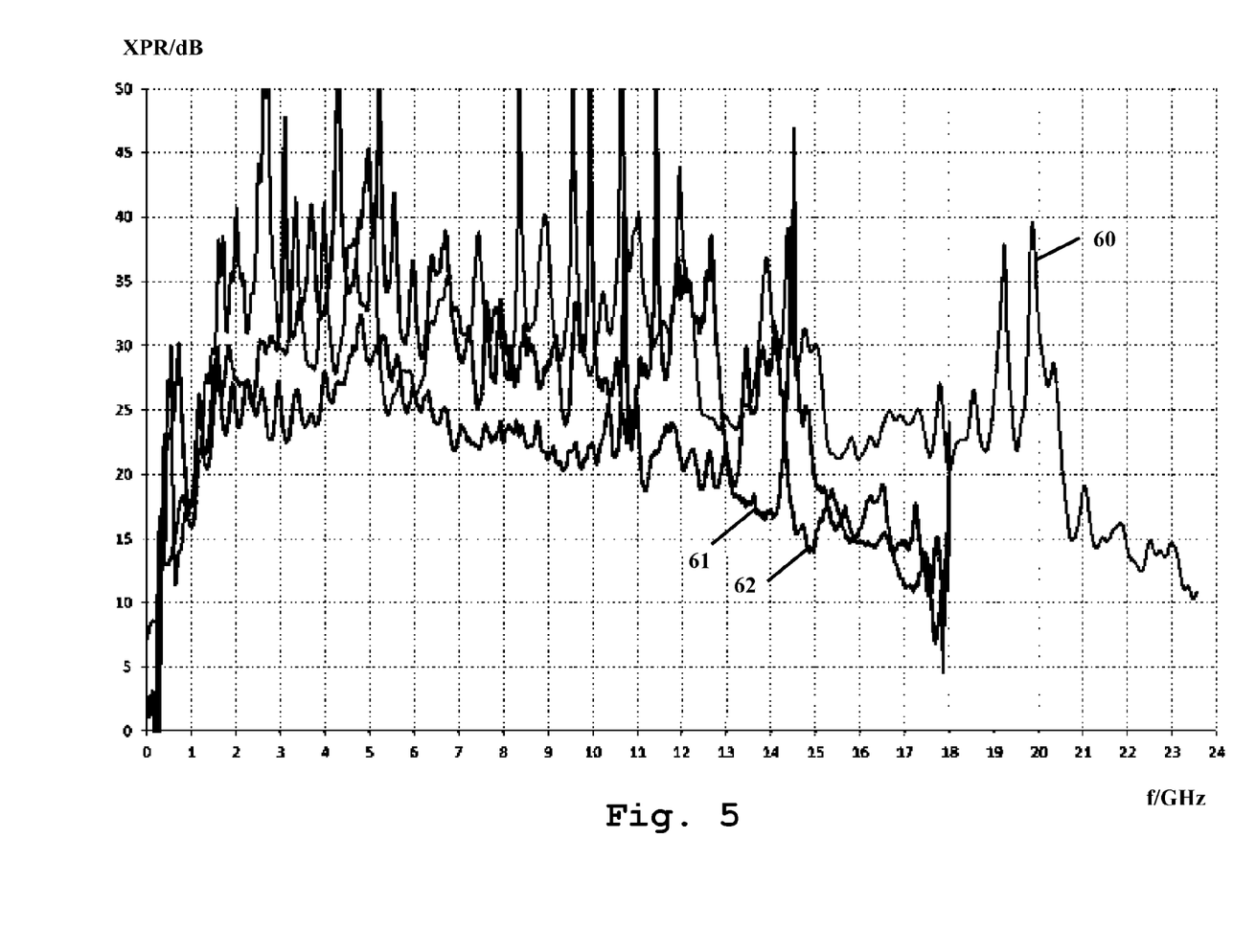
FIG. 5 shows an achievable XPR by use of an inventive antenna.

Moreover, in FIG. 5, the cross-polarization of different antenna types is depicted. Curve 60 shows the cross-polarization XPR of an exemplary embodiment of the inventive antenna while the curve 61 and 62 show the cross-polarization of regular broadband antennas. Also here it can be seen that the inventive antenna is most advantageous.

Second Embodiment

Figure 6:
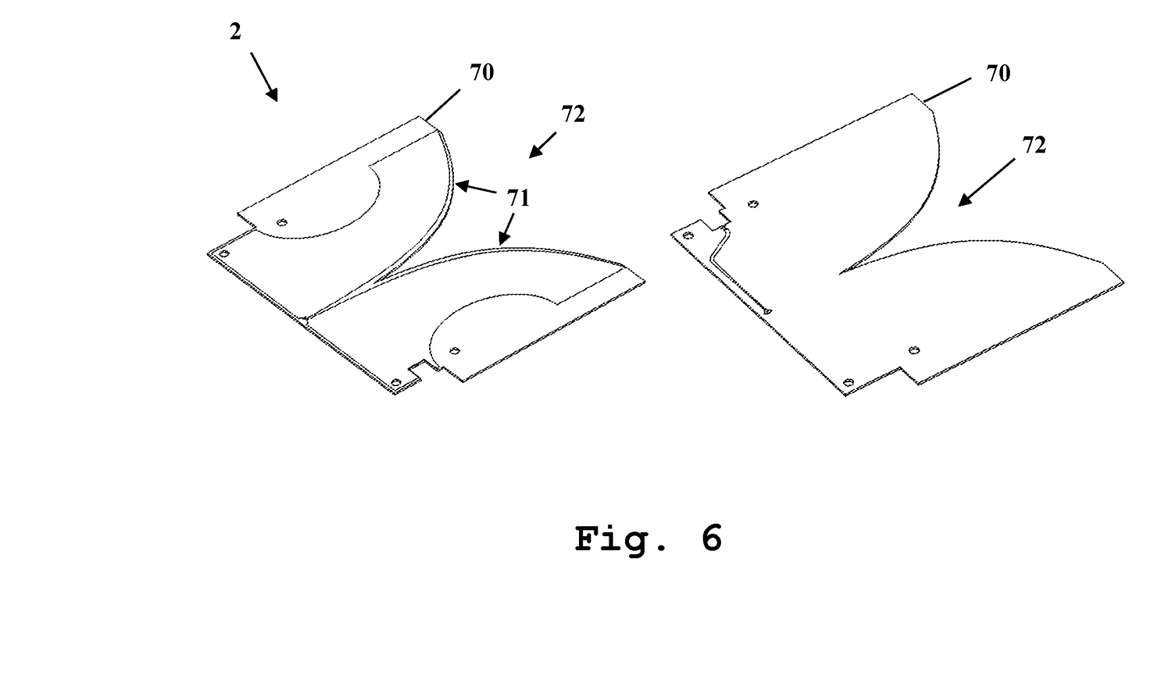
FIG. 6 shows a second embodiment of the inventive antenna in a front- and back-view with hidden absorbers.

In FIG. 6, a second embodiment of the inventive antenna is shown. In this embodiment, the antenna 2 does not necessarily comprise absorber elements. The circuit board 70 of the antenna 2 here furthermore comprises a recess 72 at the emitting side of the antenna 2. The shape of the circuit board 70 follows the shape of emitting edges 71 of the antenna elements. The circuit board 72 though extends beyond the shape of the antenna elements into the emitting direction of the antenna slightly. A current flowing in the antenna elements at the emitting edge of the antenna elements results in an electromagnetic field along the emitting edge of the antenna elements being present in the surround air and in the circuit board dielectric. These two media have different electrical permittivity creating dispersion effect. The cut 72 reduces the dispersion and increase radiation directivity.

Figure 7:
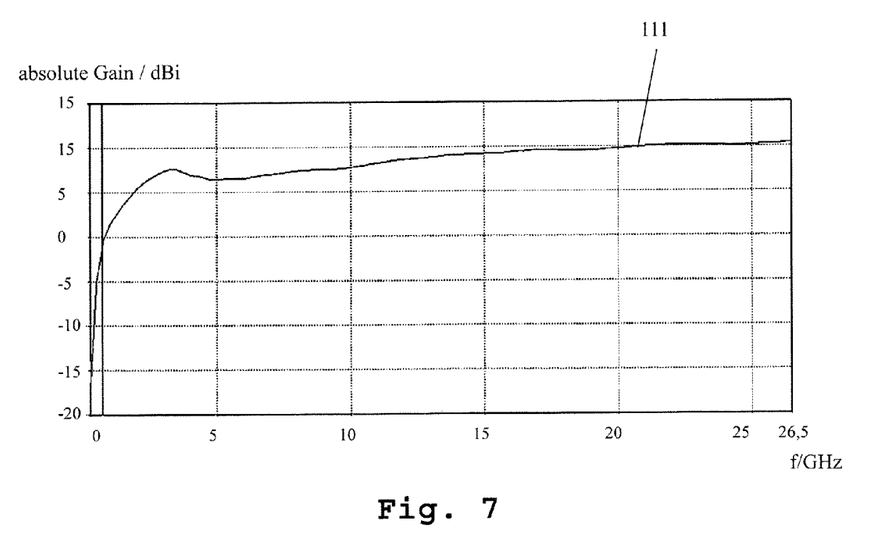
FIG. 7 shows an absolute gain achievable by use of an inventive antenna with a cut.

Moreover, in FIG. 7, the absolute gain 111 of an embodiment as shown in FIG. 6 is depicted. Gain does not drop above 12 GHz like it was shown in FIG. 4 for an antenna without the cut 72.

Alternatively, the features of the embodiments shown in FIG. 1 and FIG. 2 and FIG. 6 can be combined. Then the absorber elements 20-23 of FIG. 2 are arranged on the circuit board 72 of FIG. 6. In this combined embodiment a high directivity and a high bandwidth can be achieved.

Third Embodiment

Figure 8:
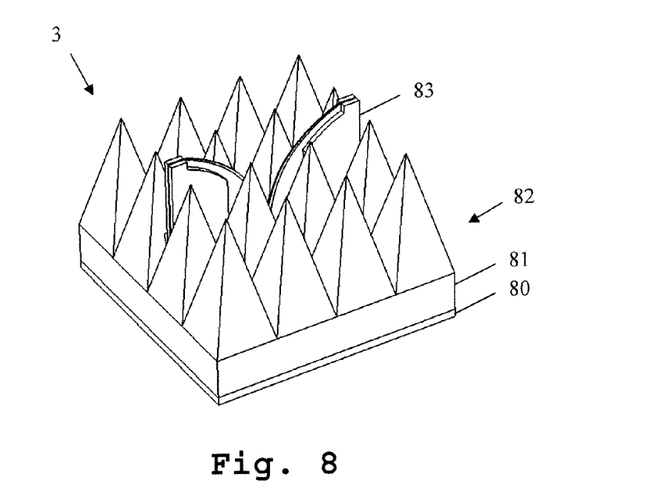
FIG. 8 shows a third embodiment of the inventive antenna.

In FIG. 8, a third embodiment of an inventive antenna 83 is shown. The antenna 83 is part of an antenna system 3 which is comprised by the antenna 83, a base plate 80, on which the antenna 83 is mounted perpendicularly, an absorber base 81 mounted on the base plate 80 and a plurality of absorbers mounted on the absorber base 81. The absorbers 82 extend from a non-emitting side of the antenna towards the emitting side of the antenna 83 and are mounted parallel to the antenna. The absorbers advantageously are shorter than the antenna 83. The antenna 83 is an antenna according to one of the previously shown embodiments of the inventive antenna.

Fourth Embodiment

Figure 9:
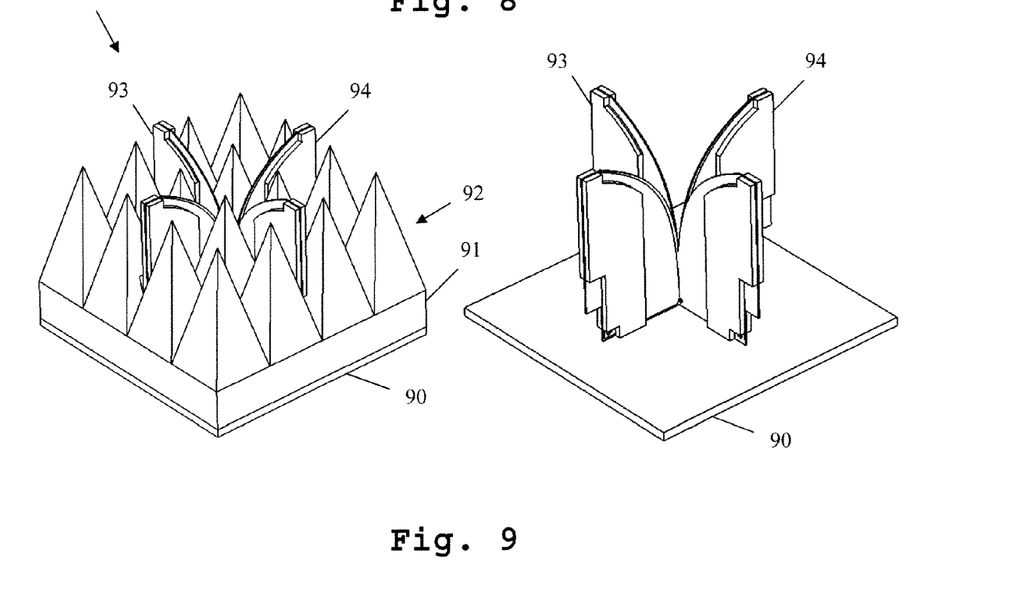
FIG. 9 shows a fourth embodiment of the inventive antenna in an antenna system in a front- and back-view and FIG. 10 shows an embodiment of the inventive measurement chamber.

In FIG. 9, an embodiment of the inventive antenna system 4 is shown. Two antennas 93 and 94 are arranged perpendicularly. They intersect at a central symmetry axis defined by the antenna elements. The antennas 93, 94 are mounted on a base plate 90, on which also an absorber base 91 and absorbers 92 are mounted. On the left side of FIG. 9, the antennas 93 and 94 and the absorber base 91 and the absorbers 92 are depicted. For reasons of clarity, on the right side of FIG. 9, the antennas 93, 94 and the base plate 90 are shown on their own.

Fifth Embodiment

Figure 10:
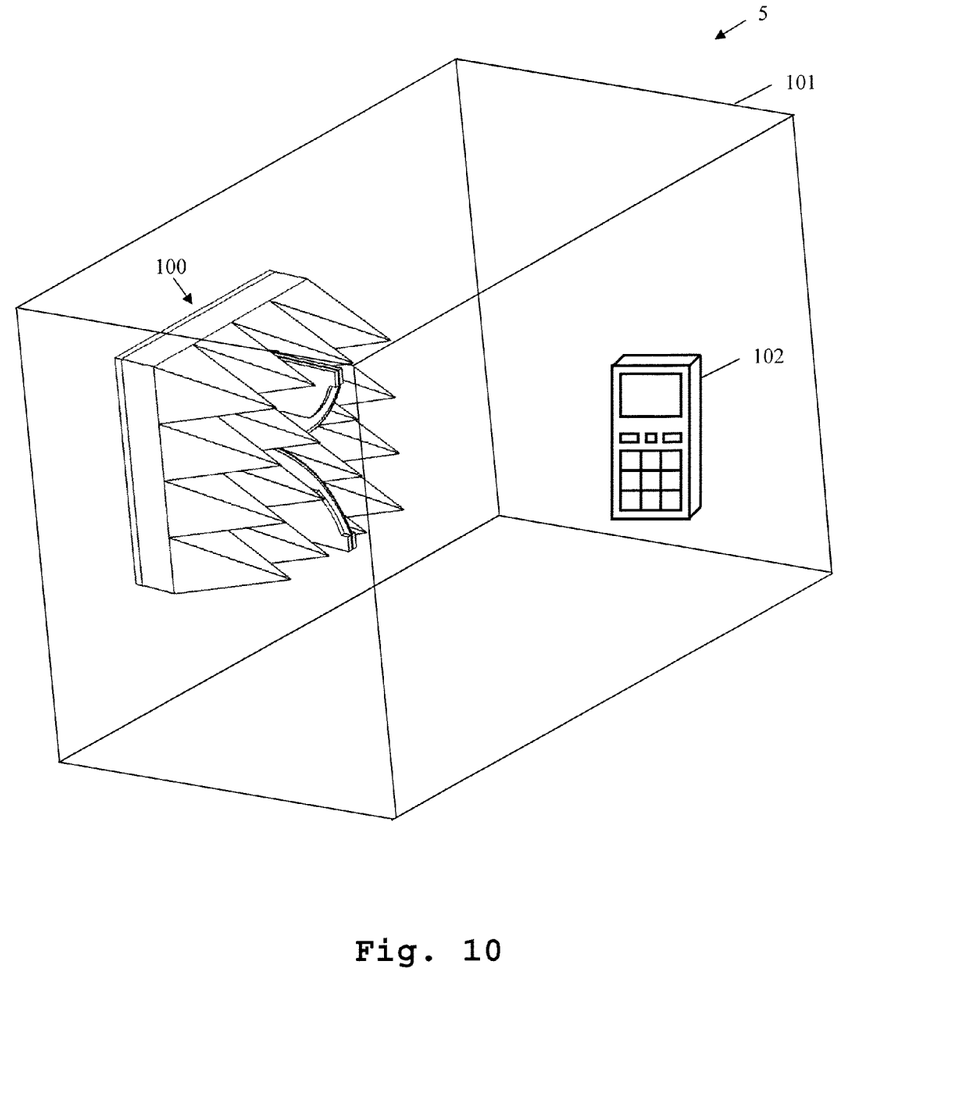

In FIG. 10, finally an embodiment of the inventive measurement chamber 5 is depicted. The measurement chamber 5 comprises a container 101, which is sealed against electromagnetic radiation and at least an antenna 100 or an antenna system according to one of the previous embodiments. The antenna 100 or the antenna system is mounted on an inner surface of the container 101. The device under test 102 is placed within the container 101. The inner surface of the container 101 is completely covered with absorbers. For reasons of clarity, only a part of these absorbers are depicted here.

The invention is not limited to the examples depicted here. The invention discussed above can be applied not only to sending antennas but also to receiving antennas. Also a use outside of measurement chambers, for example in base stations, etc. is possible. The characteristics of the exemplary embodiments can be used in any combination.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed:

1. Antenna comprising two antenna elements forming a planar slotline antenna,
   wherein the antenna comprises absorber elements on two layers surrounding a layer of the planar slotline antenna, the absorber elements are formed from a foam material having a dielectric constant $\in_r$ between 10 and 100 and shaped to:
   partially cover the antenna elements,
   partially not cover the antenna elements,
   to dampen at least a dipole-mode of the antenna elements, and
   not to dampen a slotline-mode of the antenna elements,
   wherein the antenna elements comprise a metallization layer on a circuit board, wherein the absorber elements are located on the metallization layer side of the circuit board and on a non-metallization layer side of the circuit board,
   wherein the metallization layer is largely covered by a protective coating, and wherein the protective coating is interrupted in a feed line connection area,
   wherein the feed line connection area is located at the narrowest point between the two antenna elements, and
   wherein the antenna elements are not connected electrically.

2. Antenna according to claim 1, wherein the absorber elements on the two layers are of identical or nearly identical shape.

3. Antenna according to claim 1, wherein that the antenna elements are tapered.

4. Antenna according to claim 1, wherein the antenna elements form a Vivaldi-antenna.

5. Antenna according to claim 1, wherein the absorber elements are shaped to cover outer sections of the antenna elements, and that the absorber elements are shaped to not cover inner sections of the antenna elements.

6. Antenna according to claim 1, wherein the antenna elements are formed by a metallization layer on a circuit board, wherein the absorber elements are shaped to cover outer sections of the antenna elements, and wherein the circuit board and the absorber elements extend beyond the outer sections of the antenna elements.

7. Antenna according to claim 1, wherein the antenna elements are formed by a metallization layer on a circuit board, wherein the antenna comprises a connector for connecting an external line, and wherein the antenna comprises a feed line connected to the connector and to the antenna elements for feeding a signal from the external line to the antenna elements.

8. Antenna according to claim 1, wherein the antenna elements are formed by a metallization layer on a circuit board, wherein the antenna comprises a connector for connecting an external line, wherein the antenna comprises a feed line connected to the connector and to the antenna elements for feeding a signal from the external line to the antenna elements, and wherein the feed line forms an impedance transformer.

9. Antenna according to claim 1, wherein the antenna elements are formed by a metallization layer on a circuit board, wherein the antenna elements comprise radiating edges, wherein the shape of the circuit board follows the shape of the radiating edges in general and extends beyond the radiating edges.

10. Antenna system comprising two antennas according claim 1, wherein the antennas are mounted perpendicularly, intersecting along a symmetry axis between their antenna elements.

11. Antenna system according to claim 10, comprising a base plate mounted perpendicular to both antennas on a non-radiating side of the antennas and comprising absorbers mounted on the base plate.

12. Antenna comprising two antenna elements forming a planar slotline antenna, wherein the antenna elements comprise a metallization layer on a circuit board, wherein the antenna elements comprise radiating edges, wherein the shape of the circuit board follows the shape of the radiating edges and extends beyond the radiating edges, wherein the antennas are mounted perpendicularly, intersecting along a symmetry axis between their antenna elements,
   a base plate mounted perpendicular to both antennas on a non-radiating side of the antennas and comprising absorbers mounted on the base plate, and
   absorbers mounted on the base plate, wherein the absorbers are formed from a foam material having a dielectric constant $\in_r$ between 10 and 100,
   wherein the metallization layer is largely covered by a protective coating, and wherein the protective coating is interrupted in a feed line connection area,
   wherein the feed line connection area is located at the narrowest point between the two antenna elements, and
   wherein the antenna elements are not connected electrically.

* * * * *